United States Patent [19]

Müller

[11] Patent Number: 5,157,018
[45] Date of Patent: Oct. 20, 1992

[54] PERFLUOROALKYL GROUP-CONTAINING POLYMERS AND REPRODUCTION LAYERS PRODUCED THEREFROM

[75] Inventor: Werner H. Müller, E. Greenwich, R.I.

[73] Assignee: Hoechst Aktiengesellschaft, Frankfurt am Main, Fed. Rep. of Germany

[21] Appl. No.: 833,033

[22] Filed: Feb. 10, 1992

Related U.S. Application Data

[60] Division of Ser. No. 630,176, Dec. 19, 1990, Pat. No. 5,104,961, which is a division of Ser. No. 141,531, Jan. 7, 1988, Pat. No. 5,006,443, which is a continuation of Ser. No. 742,393, Jun. 7, 1985, abandoned.

[30] Foreign Application Priority Data

Jun. 8, 1984 [DE] Fed. Rep. of Germany ....... 3421448

[51] Int. Cl.$^5$ .............. C08F 6/00; C08G 4/00; C08G 8/14; C08G 8/18
[52] U.S. Cl. .................... 528/493; 528/480; 528/125; 528/129; 528/152; 528/154; 528/161; 528/171; 528/173; 528/174; 528/151; 430/96; 430/175; 430/176; 430/192; 430/197; 430/270; 430/281; 430/303
[58] Field of Search .............. 528/129, 125, 151, 152, 528/154, 161, 171, 173, 174, 480, 493; 430/192, 96, 270, 281, 303, 905

[56] References Cited

U.S. PATENT DOCUMENTS

| | | | |
|---|---|---|---|
| 3,468,926 | 9/1969 | Dorman | 528/151 |
| 3,658,759 | 4/1972 | Eglin et al. | 528/151 |
| 4,725,523 | 2/1988 | Miura et al. | 528/129 |
| 4,877,859 | 10/1989 | Tamaru et al. | 528/151 |
| 5,021,539 | 6/1991 | Armbruster et al. | 528/129 |

*Primary Examiner*—John Kight, III
*Assistant Examiner*—Duc Truong
*Attorney, Agent, or Firm*—Foley & Lardner

[57] ABSTRACT

Polymers comprising perfluoroalkyl groups, reproduction layers containing these polymers and use thereof for waterless offset printing. The novel perfluoroalkyl group-containing polymers comprise polymers or polycondensates and have, in each case as substituents on different carbon atoms of benzene rings, phenolic OH groups and perfluoroalkyl groups which are optionally attached through intermediate members. In particular, at least 10% of the polymer units carry perfluoroalkyl groups. These polymers are either formed by condensation of substituted phenols (e.g., 4-hydroxybenzoic acid-perfluoroalkyl ester) with an aldehyde, a ketone, or a reactive bismethylene compound or by reacting polymers containing phenolic OH groups (e.g., hydroxypolystyrene) or polycondensates containing reactive OH groups (e.g., phenol-formaldehyde resins) with a perfluoroalkyl group-containing compound (e.g., 2,2-dihydroperfluorodecanoic acid chloride). The novel polymers are particularly useful in radiation-sensitive reproduction layers which additionally contain at least one radiation-sensitive compound. Reproduction layers of this kind are applied as radiation-sensitive coatings to support materials for printing plates used in waterless offset printing.

2 Claims, No Drawings

PERFLUOROALKYL GROUP-CONTAINING POLYMERS AND REPRODUCTION LAYERS PRODUCED THEREFROM

This application is a divisional of application Ser. No. 07/630,176, filed Dec. 19, 1990, now U.S. Pat. No. 5,104,967 which is a divisional application of Ser. No. 07/141,531 filed on Jan. 7, 1988, now U.S. Pat. No. 5,006,443 which is a continuation application of Ser. No. 06/742,393 filed on Jun. 7, 1985, now abandoned.

BACKGROUND OF THE INVENTION

The present invention relates to polymers comprising perfluoroalkyl groups and to a process for the production of these polymers. The invention also relates to radiation-sensitive reproduction layers containing these polymers as binders and to the use of these reproduction layers for waterless offset printing.

Other than in the customarily used offset-printing process, where differentiation between image areas and non-image areas during printing is effected by the simultaneous action of water or water-containing liquids on the one hand, and printing ink on the other hand, differentiation in waterless planographic printing, particularly offset printing, normally results from the fact that the ink-receptive, i.e., oleophilic, image areas and the ink-repellent, i.e., oleophobic, non-image areas (which are not moist with water) on a printing plate surface show different interactions with the printing ink. From the state of the art, the following publications are known, which deal with this subject:

U.S. Pat. No. 3,677,178 discloses a printing plate in which a support material comprising a metal, a plastic or paper is coated with a layer of a hydrophobic and oleophobic silicone rubber and a radiation-sensitive reproduction layer, in the indicated or in the reverse order. As the radiation-sensitive compound, the reproduction layer contains ammonium dichromate, formaldehyde condensates of diphenylamine-4-diazonium salts, or polyvinyl cinnamate. In the printing process, the ink-receptive areas either comprise bared portions of the support material or portions of the reproduction layer which have been cured by irradiation.

In the printing plate according to U.S. Pat. No. 3,511,178 and U.S. Pat. No. 3,682,633, the support material is first coated with a radiation-sensitive reproduction layer and then with a coating having a lower release value (reduced adhesive interaction) with respect to printing inks than the support material. The last-mentioned coating either comprises a polysiloxane (silicone elastomer) or a fluorine-containing organic compound, for example, a homopolymer of the methacrylic acid ester of perfluorooctanol.

Further embodiments of printing plates for waterless offset-printing and of compounds which are suitable for use in printing plates of this kind are, for example, disclosed in the following publications:

U.S. Pat. No. 3,953,212 discloses a combination of a radiation-sensitive compound and a silicone rubber in one layer which is applied to one of the customary support materials. The printing plate according to German Auslegeschrift No. 24 22 428 (equivalent to British Patent No. 1,464,123) contains a photopolymerizable polysiloxane and a photosensitizer in a single layer.

In German Offenlegungsschrift No. 25 24 562 (equivalent to British Patent No. 1,501,128) radiation-sensitive coatings are described, which comprise an aromatic diazonium cation, an anion of a carboxylic acid or sulfonic acid containing perfluoroalkyl groups and, optionally, a polymeric organic binder. It is stated that these layers can be used for printing directly after irradiation, i.e., a developing step is not required.

The printing plates according to U.S. Pat. No. 4,087,584 comprise, in an oleophobic coating, a fluorine-containing homopolymer or copolymer having monomer units derived from acrylic or methacrylic acid esters containing perfluoroalkyl groups, 4-perfluoroalkoxy-benzoyloxy-alkyl groups, or perfluoroalkanesulfonamido-alkyl groups. In copolymers, the proportion of the fluorine-containing monomer units exceeds 75%. This oleophobic coating is either present directly on a support material and image areas are applied to the coating, or it is present on top of an electrophotographically working reproduction layer. In the latter case, toner images are produced on the oleophobic coating.

U.S. Pat. No. 3,910,187 discloses various possibilities of producing printing plates for use in waterless offset printing by applying an intermediate or final layer to customary photopolymer printing plates (i.e., printing plates comprising a support material and a reproduction layer containing photopolymerizable compounds). These intermediate or final layers comprise perfluoroalkyl group-containing carboxylic acids, sulfonic acids, phosphonic acids and amines or polymers of perfluoroalkyl group-containing acrylic or methacrylic acid esters, maleic acid diesters, vinyl ethers, carboxylic acid vinyl esters, sulfonamido-allyl esters, and the like. The polymers are either prepared from the above-indicated monomers before application to the printing plate or are produced by photopolymerization directly on the printing plate.

According to published European Patent Application No. 0,037,094, it is possible to prepare radiation-sensitive polymers for, among other uses, as a coating for printing plates, which contain copolymers of a) acrylic or methacrylic acid perfluoroalkyl esters and b) acrylic or methacrylic acid azidobenzoyloxyalkyl esters. In addition to these copolymers, radiation-sensitive reproduction layers can also contain alkaline-developable organic binders and customary additives. After irradiation and development, a relief image is produced on the support material. Published European Patent Application No. 0,040,841 describes radiation-sensitive polymers, comprising copolymers of a) monomers having perfluoroalkyl end groups and ethylenically unsaturated end groups and b) monomers having radiation-sensitive groups and ethylenically unsaturated groups. The monomers mentioned under a) include, for example, acrylic or methacrylic acid perfluoroalkyl esters and the monomers mentioned under b) include, for example, methacrylic acid azidobenzoyloxyalkyl esters, acrylic acid cinnamoyloxyalkyl esters, methacrylic acid benzoylphenyl esters, or methacrylic acid cinnamoylphenyl esters.

From published European Patent Application No. 0,096,845, radiation-sensitive polymers are known which comprise copolymers of a) acrylic or methacrylic acid-2-perfluoroalkoxy-2-fluoro-ethyl-1-esters or related compounds, b) monomers containing radiation-sensitive groups and ethylenically unsaturated groups, and c) optionally further fluorine-free copolymerizable vinyl monomers.

In the hitherto known reproduction layers for the production of printing plates used in waterless offset printing, organic solvents such as 2-butoxy-ethanol-1, ethylene glycol monoethyl ether, methylene chloride, dioxane, or hexafluoro-m-xylene, must frequently be used in the developing step, such that expensive redistillation units and the like are required to enable an ecologically acceptable reclaiming of these solvents. Moreover, the synthesis of the starting components is often difficult (for example, requiring several stages), so that they are not at all or only to a minor degree suitable for large-scale industrial application. Reproduction layers which do not contain a binder and/or are not subjected to an additionally differentiating developing step after the irradiation thereof, generally do not yield relatively large print runs. Reproduction layers which include a binder and already contain a fluoroalkyl group-containing compound as the radiation-sensitive component, are not readily prepared, since it is often impossible or at least difficult to combine the customary binders with these compounds to form a homogeneously acting coating. The effects of a possible incompatibility of the two principal components of reproduction layers, i.e., the radiation-sensitive component and the binder component, frequently do not appear in the preparation of the coating composition, but are discovered only during or after drying of the layers, i.e., when the solvent or dispersing agent is removed.

SUMMARY OF THE INVENTION

It is accordingly an object of the present invention to synthesize novel perfluoroalkyl group-containing polymers, particularly for use in the field of waterless offset printing.

It is another object of the invention to synthesize polymers, as above, which exhibit a good compatibility with other components.

It is yet another object of the invention to synthesize polymers, as above, which can, as far as possible, be produced from commercially available starting materials (educts).

Still another object of the invention is to synthesize polymers, as above, which are developable with aqueous solutions (particularly aqueous-alkaline solutions) after irradiation, when they are used in reproduction layers.

These objects are achieved, according to the invention, by a perfluoroalkyl group-containing polymer which comprises repeating units containing benzene rings. The polymer contains perfluoroalkyl groups and phenolic OH groups on at least some of the benzene rings. The perfluoroalkyl groups are attached at positions on the benzene rings different from where the phenolic OH groups are attached.

The objects of the invention are further achieved by a process for preparing a perfluoroalkyl group-containing polymer, which comprises the step of condensing perfluoroalkyl substituted phenol with a compound selected from the group consisting of an aldehyde, a ketone and a reactive bismethylene compound.

The objects of the invention are still further achieved by a process for preparing a perfluoroalkyl group-containing polymer, which comprises the step of reacting a polymer containing phenolic OH groups or a polycondensate containing reactive OH groups, with a perfluoroalkyl group-containing compound selected from the group consisting of carboxylic acids, carboxylic acid halides, carboxylic acid esters, halides, alcohols, sulfonic acids and sulfonic acid halides.

The objects of the invention are also achieved by a radiation sensitive reproduction layer which comprises at least one radiation-sensitive compound, and at least one organic polymeric binder, the binder being a perfluoroalkyl group-containing polymer comprising repeating units containing benzene rings and having phenolic OH groups and perfluoroalkyl groups on at least some of the benzene rings.

DETAILED DESCRIPTION OF THE INVENTION

The invention provides perfluoroalkyl group-containing polymers which are characterized in that they contain—in each case as substituents on different carbon atoms of benzene rings—phenolic OH groups and perfluoroalkyl groups which are optionally attached through intermediate members. The polymers can, in particular, be described by the following formulae:

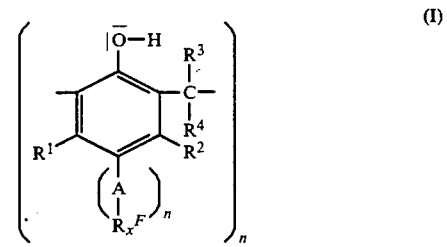

(I)

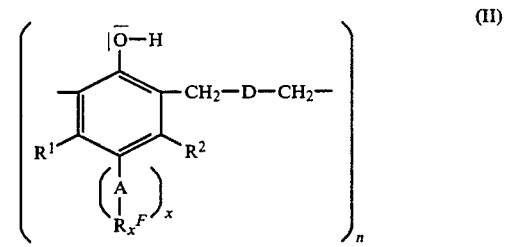

(II)

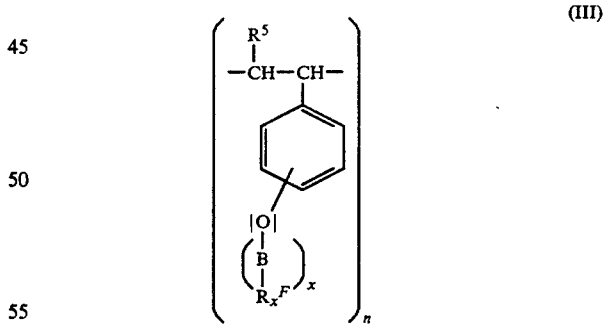

(III)

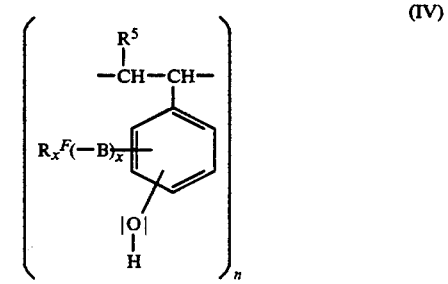

(IV)

-continued

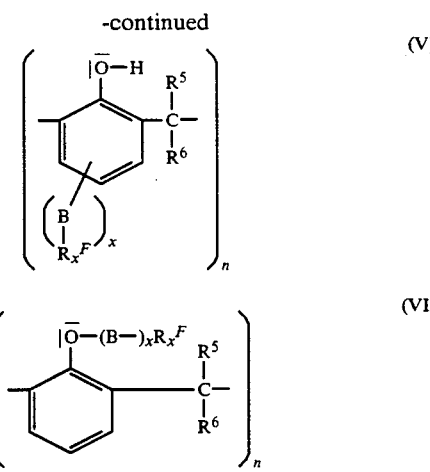

In these formulae (I) to (VI): $R^1$, $R^2$ are selected from the group consisting of H, alkyl from $C_1$ to $C_6$, $R^F$, $\underline{O}$—H, $\underline{O}$-alkyl ($C_1$ to $C_6$), and

F is selected from the group consisting of $F(C_wF_{2w})$—$(-CH_2)_z$ and $F(C_{w-1}F_{2w-2})$—$CF=CH$, the difluoromethylene groups optionally being linked through ether bridges; w is 5 to 15; z is 0 to 5; x is 0 or 1; $R^3$, $R_4$ are selected from the group consisting of alkyl from $C_1$ to $C_6$, H, phenyl, and $R^F$; n is 5 to 10,000; A is selected from the group consisting of

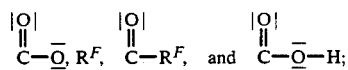

D is selected from the group consisting of $C_1$ to $C_8$ alkylene, phenylene, naphthylene, biphenylene and biphenylene bridged by ether, thioether or carbonyl groups; $R^5$, $R^6$ are selected from the group consisting of H, alkyl from $C_1$ to $C_6$, phenyl, and naphthyl; B is selected from the group consisting of

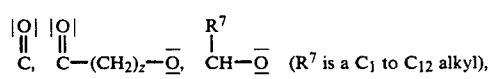

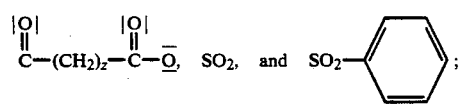

if in $(B—)_xR^F_x$ both indices denote 0, the substituent is replaced by an H.

In formulae (III) and (IV), the benzene ring can moreover carry substituents which are customary in phenol resins. These include, for example, alkyl groups from $C_1$ to $C_6$, halogens such as Cl or Br, or alkoxy groups from $C_1$ to $C_4$. The polymers corresponding to formulae (I) and (II) are built up in such a way that at least 10% and up to 100%, particularly from 30% to 100%, of the polymer elements (polymer units) carry perfluoroalkyl groups. In the polymers corresponding to formulae (III) to (VI), at least 10% and up to 90%, particularly from 15% to 60%, of the polymer elements carry perfluoroalkyl groups. The proportion of perfluoroalkyl groups can be monitored on the one hand—particularly in the polymers corresponding to formulae (I) and (II)—by the selection of substituents and, on the other hand, also by the process for the preparation of the polymers. This last-mentioned variant is particularly suitable in the subsequent introduction of perfluoroalkyl groups into polymers which are already present [formulae (III) to (VI)]. In that case, the polymers comprising units corresponding to formulae (III) and (VI) can also contain unsubstituted —$\underline{O}$—H groups, in lieu of the substituents —$\underline{O}$—$(B—)_xR^F_x$. The polymers comprising units corresponding to formulae (IV) and (V) may have an H instead of the substituents —$(B—)_xR^F_x$, such that different units may occur in the polymers according to the present invention.

Of the above-mentioned compounds, those according to formulae (I), (II), (V), and (VI) are co-condensates and those according to formulae (III) and (IV) are co-polymers. The perfluoroalkyl group is, either directly or through an unbranched or branched, saturated or unsaturated alkylene intermediate member having from 1 to 5 carbon atoms, linked to the respective molecular radical. The perfluoroalkyl groups as such are unsaturated or saturated, branched or unbranched and usually have from 4 to 20, particularly from 5 to 15, carbon atoms. They are preferably unbranched molecular radicals and have at most two double bonds in each molecular radical.

The molecular weights of the polymers according to the invention are in the range from about 1,000 to 100,000, particularly from 1,200 to 50,000.

The polymers of the present invention can be prepared as follows: The compounds of formulae (I) and (II) by condensing a phenolic component (VII) with an aldehyde or ketone corresponding to formula (VIII) or a reactive bismethylene compound corresponding to formula (IX)

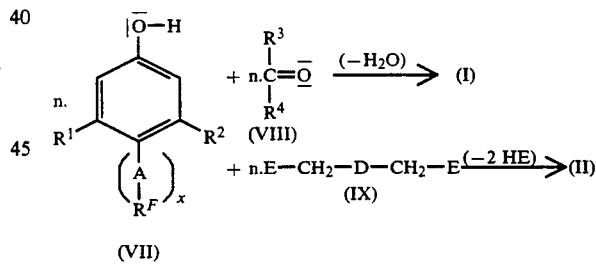

in which E=$\underline{O}$—H, $\underline{O}$-alkyl ($C_1$ to $C_4$), Cl, or Br. Part of the compounds of formula (VII) can also be replaced by compounds, in which the substituent —$(A—)_xR^F_x$ is replaced by a carboxyl group

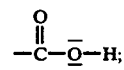

however, at least 10%, particularly at least 30%, of these educts should carry a perfluoroalkyl radical, either as the radical $R^1$ or $R^2$ or in the substituent —$(A—)_xR^F_x$.

The compounds corresponding to formulae (III) to (VI) can be prepared from the polymers (X) or the polycondensates (XI), by reaction with perfluoroalkyl group-containing carboxylic acids, carboxylic acid halides, carboxylic acid esters, halides, alcohols, sulfonic acids, or sulfonic acid halides corresponding to formula (XII):

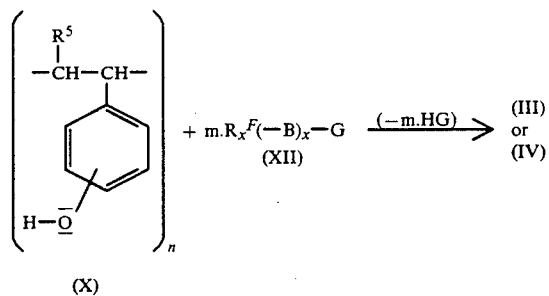

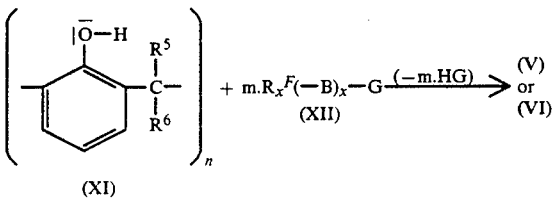

in which G is $\overline{O}$—H, Br or Cl, or $\overline{O}$-alkyl ($C_1$ to $C_6$), and m is less than n and amounts to at least 10% and up to 90% of n.

Examples of compounds corresponding to formula (VII) include: esters formed from aromatic hydroxycarboxylic acids with perfluoroalkyl group-containing alcohols, such as esters of 4-hydroxybenzoic acid, 2,6-dialkyl-4-hydroxybenzoic acid, salicylic acid, $\alpha$ and $\beta$-resorcylic acid, gallic acid, $\beta$-hydroxynaphthoic acid; reaction products of aromatic hydroxy compounds with perfluoroalkyl group-containing reactive compounds corresponding to the following formula (XII) produced in an alkaline (for example, in the presence of triethylamine) or acid medium (for example, in the presence of $AlCl_3$):

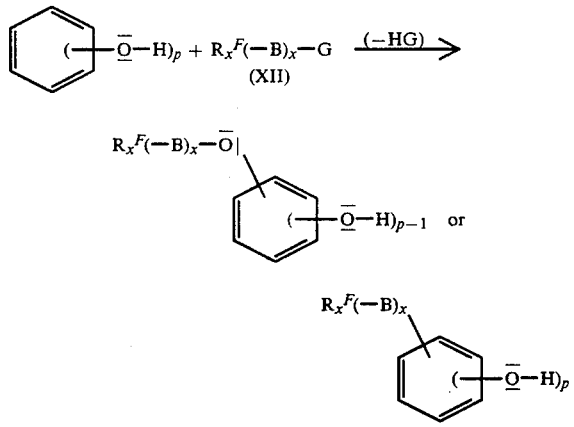

in which p is 1 or 2; and reaction products from phenol, resorcinol or substituted resorcinols with perfluoroalkyl group-containing acid chlorides, which are either phenol esters or ketones.

The above-indicated compounds of formula (VII) can be condensed with aldehydes, such as formaldehyde, acetaldehyde, and benzaldehyde or with ketones, such as acetone, as is known in the art, to form the phenol resins (I) and (II), which have excellent hydrophobic and oleophobic properties. Instead of the aldehydes or ketones, it is also possible to use compounds corresponding to formula (IX), such as bischloromethyl compounds or bishydroxymethyl compounds (for example, bismethoxymethyl-benzene, bishydroxymethyl-benzene, bischloromethyl-benzene, bismethoxymethyl-diphenylether or 2,6-bismethoxymethyl-pyridine). The aforementioned phenols can be reacted individually or in mixtures with other fluorine-containing or fluorine-free phenols. In the last-mentioned procedure, it is particularly favorable to perform a co-condensation with carboxyl group-containing phenols since, in this manner, solubility in aqueous-alkaline solutions can additionally be controlled.

Examples of polymers corresponding to formulae (X) and (XI) are hydroxypolystyrenes (polymers), marketed under the trade name of "Resin M" by Maruzen Oil Co. and phenol-formaldehyde resins (polycondensates) marketed under the trade name "Alnovol PN 429" by HOESCHST AG. Maximally 90% of the hydroxyl groups of these polymers are reacted with compounds according to formula (XII), having reactive perfluoroalkyl groups. Reaction is, in particular, run in an alkaline or acid medium. Suitable compounds corresponding to formula (XII) are, for example, 2,2-dihydro-perfluorodecanoic acid chloride, butene-2-dioic acid-monochloridemono-1',1',2', 2'-tetrahydroperfluorooctyl-1'-ester, 3-perfluorooctylbenzene sulfonic acid chloride, or 2-chloropropanoic acid-1',1',2',2'-tetrahydroperfluorooctyl-1'-ester.

The perfluoroalkyl group-containing polymers of the present invention can be used in the production of hydrophobic and oleophobic compositions, such as varnishes, impregnating or coating agents. A preferred use is in the preparation of radiation-sensitive reproduction layers. Therefore, the invention also provides radiation-sensitive reproduction layers containing (c) at least one radiation-sensitive compound and (d) at least one organic polymeric binder, wherein component (d) is a polymer comprising the above-defined components. The binders used include, in particular, polymers which are soluble in aqueous-alkaline solutions. If the polymers of the present invention are used as component (d) in reproduction layers, component (c) particularly comprises compounds which also contain fluorine or, preferably, perfluoroalkyl groups, since this will frequently result in an improved miscibility of components and thus in a coating which is even optically more uniform. In addition to the polymers according to the invention, the reproduction layers can also contain binders which are different from the polymers, but the proportion of such different binders should not exceed 40% of the amount of binder used.

Examples of suitable binders are: polyamides, polyvinyl esters, polyvinyl acetals, polyvinyl ethers, polyacrylates, polymethacrylates, polyesters, alkyd resins, polyacrylamide, polyvinyl alcohol, polyethylene oxide, polydimethyl acrylamide, polyvinyl methylformamide, polyvinyl methylacetamide and copolymers of the monomers forming the enumerated homopolymers. Also suitable are binders comprising natural substances or converted natural substances, for example, gelatin or cellulose ethers.

It is advantageous to use binders which are soluble or at least swellable in aqueous-alkaline solutions, since layers comprising these binders can be developed with the preferred aqueous-alkaline developers. Binders of this kind, for example, can comprise the following groups: —COOH, —PO$_3$H$_2$, —SO$_3$H, —SO$_2$NH$_2$, and —SO$_2$—NH—CO—. Examples of such binders include: maleinate resins, polymers of β-methacryloyloxy-ethyl-N-(p-tolyl-sulfonyl)-carbamate and copolymers of these and similar monomers with other monomers, and also methylmethacrylate/methacrylic acid copolymers, or copolymers of methacrylic acid, alkylmethacrylates and methylmethacrylate and/or styrene, acrylonitrile, etc.

As component (c), i.e., the component comprising radiation-sensitive compounds, the reproduction layers basically can contain any compounds which after irradiation (exposure) and development yield a surface in imagewise configuration, which can be used for printing.

Apart from the silver halide-containing layers used for many applications, various other layers are known which are, for example, described in "Light-Sensitive Systems" by Jaromir Kosar, published by John Wiley & Sons, New York, 1965: colloid layers containing chromates and dichromates (Kosar, Chapter 2); layers containing unsaturated compounds, in which, upon exposure, these compounds are isomerized, rearranged, cyclized, or crosslinked (Kosar, Chapter 4); layers containing compounds which can be photopolymerized, in which, on being exposed, monomers or prepolymers undergo polymerization, optionally with the aid of an initiator (Kosar, Chapter 5); and layers containing o-diazoquinones, such as naphthoquinone-diazides, p-diazoquinones, or condensation products of diazonium salts (Kosar, Chapter 7). The layers which are suitable also include the electrophotographic layers, i.e., layers which contain an inorganic or organic photoconductor.

The particularly preferred radiation-sensitive compounds or systems in component (c) of the reproduction layers include the classes of compounds described for the first time in copending U.S. patent applications Ser. No. 742,392 entitled "Perfluoroalkyl Group-Containing Compounds and Reproduction Layers Produced Therefrom" (corresponding to German Patent Application No. P 34 21 511.5), and Ser. No. 742,418 entitled "Perfluoroalkyl Group-Containing 1,2-Naphthoquinone Diazide Compounds and Reproduction Materials Produced Therefrom" (corresponding to German Patent Application No. P 34 21 471.2), i.e., a system comprising at least one polymerizable, perfluoroalkyl group-containing compound having at least two ethylenically unsaturated end groups and at least one photo-initiator, or a system comprising 1,2-naphthoquinone diazide compounds having at least one perfluoroalkyl group as a substituent.

The reproduction layers generally contain from 5 to 50% of component (c). If photopolymerizable compounds or systems are used, component (c) may also be present in an amount of up to 80%. Component (d) is contained in the reproduction layers in an amount from 95 to 50% [or up to 20%, if photopolymerizable compounds are used as component (c)].

In addition to components (c) and (d), the indicated reproduction layers can contain a number of other customary additives, for example, inhibitors to prevent thermal polymerization of monomers, hydrogen donors, sensitometric regulators, levelling agents, indicators, dyes, and colored and uncolored pigments. The sum of all components should add up to 100%. These components are appropriately selected to minimize absorption in the region of actinic radiation, which is important for the initiating process. Actinic radiation is to be understood as any radiation, the energy of which corresponds at least to that of shortwave visible light. Particularly suitable are longwave ultraviolet radiation, as well as electron emission, x-ray and laser radiation. The reproduction layers are conventionally prepared. The components can, for example, be taken up in a solvent and the resulting solution or dispersion is applied to the intended support as a thin film, by casting, spraying, immersion, or roller application and is subsequently dried. The reproduction layers are exposed and developed in the customary manner. Suitable developers include aqueous, preferably aqueous-alkaline, solutions, for example, solutions of alkali metal phosphates or alkali metal silicates, which are optionally admixed with minor amounts of miscible organic solvents and wetting agents.

The polymers of the present invention, particularly in combination with the above-indicated perfluoroalkyl group-containing radiation-sensitive compounds or systems, yield highly radiation-sensitive reproduction layers of homogeneous appearance and good adhesion, which can usually be developed in aqueous-alkaline solutions and show excellent ink repellency. Unexpectedly, the copolymers of the invention can still be ink repellent, if their content of fluorine-containing units is in the range from 10 to 20%. It is particularly surprising that the polymers of the invention containing phenolic OH groups, can also be used as binders in reproduction layers of photopolymer printing plates having a high radiation-sensitivity, although one would assume that phenolic OH groups act as radical scavengers and should rather be regarded as polymerization inhibitors.

The reproduction layers of the present invention are particularly suitable in the form of a presensitized copying material which is present on a suitable support comprising, for example, aluminum, polyester, or zinc, for use in the photomechanical production of offset-printing plates for waterless offset printing. The surface of the support material comprising, for example, aluminum can also be modified by a mechanical, chemical and/or electrochemical roughening treatment, optionally followed by an anodic oxidation.

When support materials are only coated with one or several of the polymers and, if appropriate, additional binders which are different from the copolymers, layers are produced, which also show an exellent water and ink repellency and, at the same time, good mechanical strength. As is known from the state of the art, image areas can be produced even on such coated materials by the mechanical, electrical or chemical destruction of parts of the fluorine polymer film, or by the application of toner or by lettering. These image areas are then capable of accepting ink, so that even modified materials of that kind can optionally be used for printing.

In the preceding text and in the following examples, parts by weight are related to parts by volume as grams: cm$^3$ and percentages refer to weight, unless otherwise indicated.

EXAMPLE 1

Synthesis of a Monomer Component Corresponding to the Formula (VII)

5 parts by weight of 4-hydroxybenzoic acid methyl ester (0.033 mole) and 28 parts by weight of 1,1,2,2,-tetrahydroperfluorodecanol (0.06 mole) together with 2 parts by weight of an acidic ion exchanger (e.g., Amberlyst ® 15), were heated to 100° C. during 6 hours. The separating methanol was collected via a condenser. Thereafter, the excess perfluoroalcohol was distilled off as far as possible and, from the residue, the pure perfluoroester (4-hydroxybenzoic acid-1',1',2',2'-tetrahydroperfluorodecyl ester), having a melting point $F_p$ from 128° to 129° C., was recovered by repeated recrystallization from ethyl acetate. The $^1H$ and $^{19}F$-NMR spectra corresponded to the assumed structure.

ture $T_g$ (measured by means of a differential thermoanalysis instrument) about 14° C. The co-condensate comprised the following units, the ratio between the number of left-hand units and the number of right-hand units being approximately 2:1 (the calculated fluorine content was 32.5%, the actual fluorine content was 32.8%):

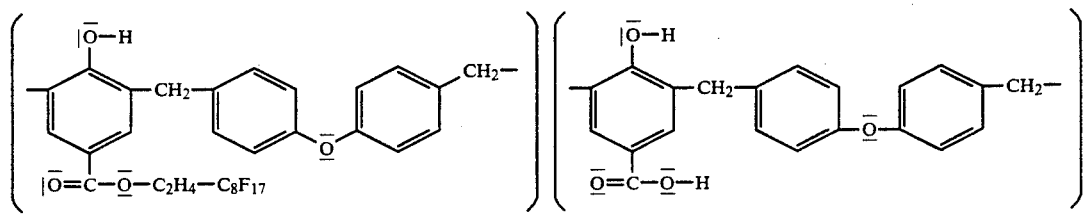

EXAMPLE 2

From gallic acid and the perfluoroalcohol, the corresponding gallic acid ester was obtained according to Example 1. After recrystallization from mixture of ethyl acetate/diisopropyl ether, this gallic acid ester had an $F_p$ from 170° to 172° C. Also in this case, the spectra obtained corresponded to the assumed structure.

EXAMPLE 3

Co-condensation

The perfluoroester was prepared as indicated in Example 1, however, the reaction mixture was heated during 15 hours to 145° C. and, without isolating the perfluoroester, 8 parts by weight of 4,4'-bis-methoxymethyl-diphenylether (MMDPE) were directly added dropwise within 1 hour at 145° C. In the procedure, the reaction mixture was rendered highly viscous and when a sample was taken by means of a glass rod, long threads could be drawn. The reaction mixture was cooled to about 50° to 60° C., diluted with acetone, removed by filtration from the ion exchanger and poured into hexane, while stirring well. After repeatedly washing with hexane, 15.7 parts by weight of a powdry co-condensate resulted, which did not contain any free perfluoroalcohol.

EXAMPLE 4

Co-condensation

The perfluoroester was first prepared as indicated in Example 1, however, the reaction was run under nitrogen at 150° C., using 15.2 parts by weight of ester (0.1 mole), 46.4 parts by weight of the perfluoroalcohol (0.1 mole) and 6 parts by weight of the ion exchanger. After about 3 hours, the expected quantity of methanol had separated and the reaction mixture was cooled to 130° C. and admixed with 6.9 parts by weight of 4-hydroxybenzoic acid in 40 parts by volume of dimethyl-diethylene glycol. Then 38.9 parts by weight of MMDPE (0.15 mole) dissolved in 30 parts by weight of dimethyl-diethylene glycol were metered in during 4 hours at 130° C. After continued stirring at 130° C., the reaction mixture was cooled, diluted with acetone and removed by filtration from the ion exchanger. With vigorous stirring, the acetone solution was slowly added dropwise to an excess quantity of water and, in the process, the co-condensate precipitated as a fibrous, solid product. The softening point of the co-condensate was in the range from 70° to 90° C., the glass transition tempera-

EXAMPLE 5

Co-condensation

According to Example 4, a white flaky powder was obtained from 0.05 mole of 2,6-dimethyl-4-hydroxybenzoic acid methyl ester, 0.05 mole of perfluoroalcohol, 0.025 mole of 4-hydroxybenzoic acid, and 0.075 mole of MMDPE. After drying for 12 hours in a circulating air oven, the co-condensate had a softening point in the range from 90° to 110° C. The fluorine analysis showed that, due to steric hindrance by the adjacent methyl groups, complete esterification had not taken place (theory: 32.7%, analysis: 28.3%). A coating formed of this co-condensate (using butanone-2and 1-methoxypropanol-2 as the solvent) and applied to a roughened aluminum foil, showed an excellent ink repellency.

EXAMPLES 6 TO 27

Introduction of a perfluoroalkyl ester into a polymer containing phenolic OH groups A formula weight of the corresponding phenol resin was dissolved in 1,000 parts by volume of acetone and the equivalent quantity of a corresponding perfluoroalkyl group-containing acid chloride, as required for the complete or partial reaction of the phenolic OH groups, was added. While cooling with ice, the equivalent quantity of triethylamine was added dropwise, the temperature being kept below 30° C. in the process. The reaction mixture was then refluxed for 2 hours. After cooling, the liquid phase was removed by filtration from the insoluble precipitate, the residue was washed with water and dried (Fraction 1). The filtrate was mixed by stirring with acidified ice water, a light precipitate being formed, which was filtered off, washed neutral and dried at 50° C. in a circulating air oven (Fraction 2). The first fraction presumably contained higher molecular weight polymers than Fraction 2. For the examples of application and analyses, Fraction 2 was used.

EXAMPLES 6 TO 18

EXAMPLES 19 TO 27

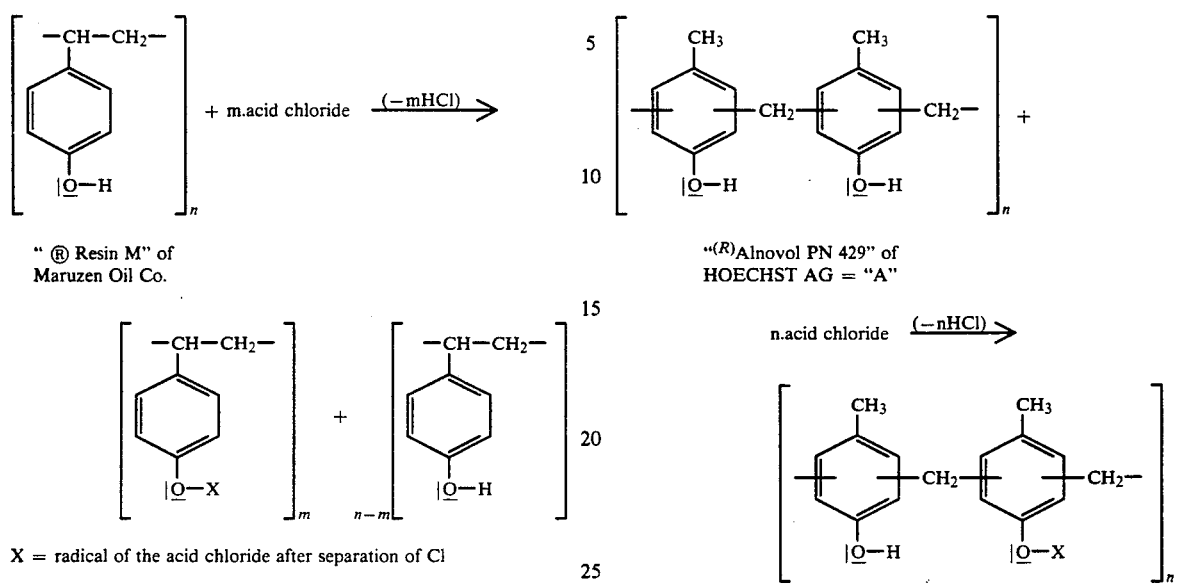

"®Resin M" of Maruzen Oil Co.

"(R)Alnovol PN 429" of HOECHST AG = "A"

X = radical of the acid chloride after separation of Cl

TABLE I

| | Educts | | | | Products | | | |
|---|---|---|---|---|---|---|---|---|
| Example | phenolic resin | parts by weight | acid chloride | parts by weight | $F_1$ parts by weight | $F_2$ | % F | $T_m$ (°C.) |
| 6 | RM 1 | 18 | $C_8F_{17}CH_2COCl$ | 22.4 | 9.7 | 24.3 | 46.6 | 150–170 |
| 7 | RM 1 | 24 | " | 22.4 | 11.9 | 28.7 | 38.6 | 150–180 |
| 8 | RM 1 | 36 | " | 22.4 | 10.8 | 40.5 | 27.7 | 190–210 |
| 9 | RM 2 | 18 | " | 22.4 | 13.7 | 21.5 | 43.3 | 130–150 |
| 10 | RM 2 | 24 | " | 22.4 | 14.9 | 25.1 | 42.6 | 150–170 |
| 11 | RM 2 | 36 | " | 22.4 | 15.2 | 40.6 | 29.6 | 190–210 |
| 12 | RM 1 | 18 | $C_{7.5}F_{16}CH_2OCO$—CH=CH—CO—Cl | 30 | 17.6 | 24.1 | 39.5 | 160–180 |
| 13 | RM 1 | 24 | | 30 | 11.2 | 35.6 | 36.7 | 150–160 |
| 14 | RM 1 | 36 | | 30 | 8.0 | 52.4 | 28.6 | 180–200 |
| 15 | RM 2 | 18 | " | 30 | 17.4 | 22.3 | 40.4 | 160–180 |
| 16 | RM 2 | 24 | " | 30 | 22.0 | 25.6 | 37.8 | 160–180 |
| 17 | RM 2 | 36 | " | 30 | 11.6 | 51.8 | 29.2 | 170–190 |
| 18 | RM 1 | 36 | $C_7F_{15}COCl$ | 19.4 | — | 38 | 11.8 | 180–200 |

RM 1 = ®Resin M" having an average molecular weight of 4,500
RM 2 = ®Resin M" having an average molecular weight of 10,000

TABLE II

| | Educts | | | | Products | | | |
|---|---|---|---|---|---|---|---|---|
| Example | phenolic resin | parts by weight | acid chloride | parts by weight | $F_1$ parts by weight | $F_2$ | % F | $T_m$ (°C.) |
| 19 | A | 24.6 | $C_{7.5}F_{16}CH_2OCO$—CH=CH—CO—Cl | 43.8 | 9.5 | 53.9 | 40.0 | 80–90 |
| 20 | A | 24.6 | | 33.2 | 6.1 | 47.4 | 35.4 | 100–120 |
| 21 | A | 24.6 | | 16.6 | — | 38.8 | 22.5 | 130–150 |
| 22 | A | 24.6 | $C_8F_{17}CH_2COCl$ | 32.8 | 3.1 | 56.6 | 37.9 | 110–130 |
| 23 | A | 24.6 | " | 24.9 | 2.0 | 42.0 | 34.1 | 120–140 |
| 24 | A | 24.6 | " | 12.5 | — | 34.6 | 22.5 | 130–150 |
| 25 | A | 9.8 | $C_8F_{17}$–C$_6H_4$–$SO_2Cl$ | 5.94 | — | 15.6 | 19.4 | 150–160 |

TABLE II-continued

| Example | Educts phenolic resin | parts by weight | acid chloride | parts by weight | Products $F_1$ parts by weight | $F_2$ parts by weight | % F | Tm (°C.) |
|---|---|---|---|---|---|---|---|---|
| 26 | A | 24.6 | $C_7F_{15}COCl$ | 21.6 | 3.3 | 34.4 | 27.9 | — |
| 27 | A | 12.3 | $Cl-CH(CH_3)-COOCH_2-CH(C_6F_{13})^*$ | 11.8 | — | 18 | — | — |

*prepared from chloropropionic acid chloride and $C_6F_{13}C_2H_4OH$ in the presence of triethylamine; moreover, triethylamine is replaced by $K_2CO_3$ in the further reaction

EXAMPLE 28

Example of Application

The polymers according to the present invention, which were obtained in Examples 3 to 27 and 15 to 18 were, in each case, dissolved in butanone-2 or a mixture of butanone-2 and 1-methoxypropanol-2 and spin-coated on a roughened aluminum foil. The coatings were then dried for 1 to 2 minutes by means of a fan and thereafter for 1 minute in a drying oven at 100° C. The resulting plates were rolled up with a commercially available printing ink for waterless offset printing. Ink repellency of the plates was excellent to good and they were practically free from scum (polymers of Examples 5, 12, 15, and 16) or showed only very little scum (polymers of Examples 3, 4, 6 to 10, 13, 14 and 19 to 25). In subsequent printing tests using coated aluminum specimens and also uncoated specimens on a printing machine, the damping unit of which had been switched off, comparable results were obtained.

EXAMPLES 29 TO 45

Examples of Application

A reproduction layer could be prepared from each of the products synthesized in Examples 3 to 27 and used as an organic polymeric binder in admixture with a perfluoroalkyl group-containing 1,2-naphthoquinone-diazide compound and a dye. For this purpose, a solution or dispersion of the components in an organic solvent [butanone-2 or 1-methoxy-propanol-2, THF, or ethylene glycol monomethyl ether (MG)] was normally prepared and coated on a support material, for example, an electrochemically roughened aluminum foil or a polyester film. Then the radiation-sensitive coating was dried.

The offset-printing plates so prepared were exposed for 20 to 150 seconds to the light of a metal halide lamp (5 kW) arranged at a distance of 100 cm from the vacuum copying frame, through a negative original. The exposed material could be developed with a 3% strength aqueous solution of $Na_2SiO_3$ (E1). After rinsing with water and briefly drying at 100° C., the printing plates produced could be used for dry printing (i.e., the damping unit of a printing machine was switched off), using commercially available special inks for waterless offset printing. The ink receptive areas included portions of the surface of the support material, while the ink repellent areas were the remaining portions of the reproduction layer.

The radiation-sensitive compounds used included V1, e.g., the reaction product of 1 mole of 2,3,4-trihydroxybenzophenone with 1 mole of $C_{7.5}F_{16}CH_2CHOOC-CH=CH-COCl$ (butene-2-di-1,4-acid monochloride-monofluoroalkyl ethyl ester) and 2 moles of 1,2-naphthoquinone-2-diazide-5-sulfonic acid chloride, and V2, e.g., the reaction product of 1 mole of 1-perfluorooctanoyloxy-2,4-dihydroxybenzene and 2 moles of the quinone diazide.

The criteria considered in evaluating the reproduction layer were the coating quality (G=good, S=satisfactory, M=moderate, P=poor) determined by visual examination prior to irradiation, development and inking and, following these process steps, the number of clean or solid steps, respectively, in a 13-step continuous tone step wedge of a wedge constant (density gradation) of 0.15 (e.g., exposure test wedge "BK01" of KALLE Niederlassung der Hoechst AG) and the reproduction of extremely fine image elements in a 12-step, 150-dot screen halftone wedge, starting from a tonal value of 5% in step 1 and ending with a tonal value of 95% in step 12 (e.g., halftone wedge "RK01" of KALLE Niederlassung der Hoechst AG); in the application of the halftone wedge, the table indicates, on the one hand, the number of steps which still repelled ink (v) (i.e., which showed non-image areas) and, on the other hand, the step which was the first to accept ink (w).

TABLE III

| Components, treating agents, judgment | | Parts by weight of components (and other parameters) in Example | | | | |
|---|---|---|---|---|---|---|
| | | 29 | 30 | 31 | 32 | 33 |
| quinone diazide | V1 | 1.4 | 1.4 | 1.4 | 1.4 | 1.4 |
| | V2 | — | — | — | — | — |
| as a binder polymer of | Ex. 4 | 0.8 | | | | |
| | 6 | | 0.8 | | | |
| | 7 | | | 0.8 | | |
| | 8 | | | | 0.8 | |
| | 9 | | | | | |
| | 10 | | | | | |
| | 12 | | | | | 0.8 |
| | 13 | | | | | |
| | 14 | | | | | |
| | 15 | | | | | |
| | 16 | | | | | |
| | 20 | | | | | |
| | 21 | | | | | |
| | 22 | | | | | |
| | 23 | | | | | |
| | 24 | | | | | |
| | 26 | | | | | |
| dye | | 0.02 | 0.02 | 0.02 | 0.02 | 0.02 |
| THF | | 5 | 5 | 5 | 5 | 5 |
| butanone-2 | | 15 | 15 | 15 | 15 | 15 |
| 1-methoxy-proponal-2 | | — | — | — | — | — |
| MG | | 4 | 4 | 4 | 4 | 4 |
| coating quality | | — | — | — | — | — |
| exposure time (seconds) | | 100 | 100 | 100 | 100 | 100 |
| developer | | E1 | E1 | E1 | E1 | E1 |
| developing time (minutes) | | 5 | 5 | 2 | 5 | 1.5 |
| cont.tone step wedge (x/y)*) | | 11/8 | 12/10 | 10/7 | 10/9 | 9/6 |

TABLE III-continued

| Components, treating agents, judgment | | Parts by weight of components (and other parameters) in Example | | | |
|---|---|---|---|---|---|
| | | 34 | 35 | 36 | 37 |
| halftone step wedge (v/w) | | 1/12 | 4/12 | 7/12 | 1/12 |
| quinone diazide | V1 | 1.4 | 1.4 | 1.4 | 1.4 |
| | V2 | — | — | — | — |
| as a binder polymer of | Ex. 4 | | | | |
| | 6 | | | | |
| | 7 | | | | |
| | 8 | | | | |
| | 9 | | | | |
| | 10 | | | | |
| | 12 | | | | |
| | 13 | 0.8 | | | |
| | 14 | | 0.8 | | |
| | 15 | | | 0.8 | |
| | 16 | | | | |
| | 20 | | | | |
| | 21 | | | | 0.8 |
| | 22 | | | | |
| | 23 | | | | |
| | 24 | | | | |
| | 26 | | | | |
| dye | | 0.02 | 0.02 | 0.02 | 0.02 |
| THF | | 5 | 5 | 5 | 5 |
| butanone-2 | | 15 | 15 | 15 | 15 |
| 1-methoxy-proponal-2 | | — | — | — | — |
| MG | | 4 | 4 | 4 | 4 |
| coating quality | | — | — | — | — |
| exposure time (seconds) | | 100 | 100 | 100 | 100 |
| developer | | E1 | E1 | E1 | E1 |
| developing time (minutes) | | 1.5 | 1.5 | 1.5 | 5 |
| cont.tone step wedge (x/y)*) | | 9/7 | 9/6 | 9/6 | 9/7 |
| halftone step wedge (v/w) | | 2/12 | 1/12 | 4/12 | 2/12 |

| Components, treating agents, judgment | | Parts by weight of components (and other parameters) in Example | | | |
|---|---|---|---|---|---|
| | | 38 | 39 | 40 | 41 |
| quinone diazide | V1 | 1.4 | 1.4 | 1.0 | 1.0 |
| | V2 | — | — | 0.5 | |
| as a binder polymer of | Ex. 4 | | | | 1.0 |
| | 6 | | | | |
| | 7 | | | | |
| | 8 | | | | 0.5 |
| | 9 | | | | |
| | 10 | | | | |
| | 12 | | | | |
| | 13 | | | | |
| | 14 | | | | |
| | 15 | | | | |
| | 16 | | | | |
| | 20 | | | | 0.5 |
| | 21 | | | | |
| | 22 | 0.8 | | | |
| | 23 | | 0.8 | | |
| | 24 | | | | |
| | 26 | | | | |
| dye | | 0.02 | 0.02 | 0.02 | 0.02 |
| THF | | 5 | 5 | — | — |
| butanone-2 | | 15 | 15 | 15 | 19 |
| 1-methoxy-proponal-2 | | — | — | 5 | 5 |
| MG | | 4 | 4 | — | — |
| coating quality | | — | — | M | G |
| exposure time (seconds) | | 100 | 100 | 100 | 100 |
| developer | | E1 | E1 | E1 | E1 |
| developing time (minutes) | | 3 | 1 | 1.5 | 1 |
| cont.tone step wedge (x/y)*) | | 9/7 | 9/6 | 7/— | 11/8 |
| halftone step wedge (v/w) | | 2/12 | 2/12 | 2/12 | 2/12 |

| Components, treating agents, judgment | | Parts by weight of components (and other parameters) in Example | | | |
|---|---|---|---|---|---|
| | | 42 | 43 | 44 | 45 |
| quinone diazide | V1 | 1.0 | 1.0 | 1.0 | 1.0 |
| | V2 | | | | |
| as a binder polymer of | Ex. 4 | | | | |
| | 6 | | | | |
| | 7 | | | | |
| | 8 | | | | |
| | 9 | | | | |
| | 10 | | | | |
| | 12 | | | | |
| | 13 | | | | |
| | 14 | 0.5 | 0.5 | 0.5 | |
| | 15 | | | 0.5 | |
| | 16 | | | | |
| | 20 | 0.5 | | | |
| | 21 | | | | |
| | 22 | | | | |
| | 23 | | | | |
| | 24 | | | 0.5 | |
| | 26 | | | | 1.0 |
| dye | | 0.02 | 0.02 | 0.02 | 0.2 |
| THF | | — | — | — | — |
| butanone-2 | | 19 | 19 | 19 | 19 |
| 1-methoxy-proponal-2 | | 5 | 5 | 5 | 5 |
| MG | | — | — | — | — |
| coating quality | | M | G | G | M |
| exposure time (seconds) | | 100 | 100 | 100 | 100 |
| developer | | E1 | E1 | E1 | E1 |
| developing time (minutes) | | 1.5 | 3 | 1 | 0.5 |
| cont.tone step wedge (x/y)*) | | 8/7 | 11/9 | 8/6 | 6/— |
| halftone step wedge (v/w) | | 1/12 | 3/12 | 1/12 | 2/12 |

*) x = number of solid steps
y = sum of solid steps and ghost steps

The foregoing description of preferred embodiments has been set forth merely to illustrate the invention and is not intended to be limiting. Since modifications of the described embodiments incorporating the spirit and substance of the invention may occur to persons skilled in the art, the scope of the invention should be limited solely with respect to the appended claims and equivalents.

What is claimed is:

1. A process for preparing a perfluoroalkyl group-containing polymer, comprising the step of condensing a perfluoroalkyl substituted phenol with a compound selected from the group consisting of an aldehyde, a ketone and a reactive bismethylene compound.

2. A process for preparing a perfluoroalkyl group-containing polymer, comprising the step of reacting a polymer containing phenolic OH groups or a polycondensate containing reactive OH groups, with a perfluoroalkyl group-containing compound selected from the group consisting of carboxylic acids, carboxylic acid halides, carboxylic acid esters, halides, alcohols, sulfonic acids and sulfonic acid halides.

* * * * *

UNITED STATES PATENT AND TRADEMARK OFFICE
CERTIFICATE OF CORRECTION

PATENT NO.    :    5,157,018
DATED         :    Oct. 20, 1992
INVENTOR(S)   :    Werner H. MÜLLER It is certified that error appears in the above-identified patent and that said Letters Patent is hereby corrected as shown below:

On the title page

Item No. [75] should read:

--Inventor:  Werner H. MÜLLER,
             Corpus Christi, Texas 78418, and

Signed and Sealed this

Twenty-fourth Day of May, 1994

Attest:

BRUCE LEHMAN

*Attesting Officer*    *Commissioner of Patents and Trademarks*

UNITED STATES PATENT AND TRADEMARK OFFICE
CERTIFICATE OF CORRECTION

PATENT NO. : 5,157,018
DATED : Oct. 20, 1992
INVENTOR(S) : Werner H. MÜLLER

It is certified that error appears in the above-indentified patent and that said Letters Patent is hereby corrected as shown below:

On the Title Page:

Item No. [73] should read:

Assignee: Hoechst Celanese Corporation
Somerville, New Jersey

Signed and Sealed this

Second Day of August, 1994

Attest:

BRUCE LEHMAN

Attesting Officer     Commissioner of Patents and Trademarks